United States Patent
Horng et al.

(10) Patent No.: US 7,528,457 B2
(45) Date of Patent: May 5, 2009

(54) METHOD TO FORM A NONMAGNETIC CAP FOR THE NIFE(FREE) MTJ STACK TO ENHANCE DR/R

(75) Inventors: Cheng T. Horng, San Jose, CA (US); Hui-Chuan Wang, Pleasanton, CA (US); Min Li, Dublin, CA (US); Ru-Ying Tong, Los Gatos, CA (US); Tong Zhao, Fremont, CA (US); Yimin Guo, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 209 days.

(21) Appl. No.: 11/404,446

(22) Filed: Apr. 14, 2006

(65) Prior Publication Data
US 2007/0243638 A1 Oct. 18, 2007

(51) Int. Cl.
*H01L 29/82* (2006.01)
*G11C 11/02* (2006.01)

(52) U.S. Cl. .......................... 257/421; 257/427; 438/3; 360/313; 360/324; 365/158; 365/171; 365/173

(58) Field of Classification Search ......... 257/421–427; 438/3, 133, 800; 360/130, 324.1, 313; 365/149
See application file for complete search history.

(56) References Cited

U.S. PATENT DOCUMENTS

| | | | |
|---|---|---|---|
| 6,266,218 B1 | 7/2001 | Carey et al. | |
| 6,893,714 B2 | 5/2005 | Moriwaki et al. | |
| 6,909,630 B2 | 6/2005 | Tsang | |
| 6,909,633 B2 | 6/2005 | Tsang | |
| 2002/0045070 A1 | 4/2002 | Sakakima et al. | |
| 2005/0254291 A1 | 11/2005 | Horng et al. | |
| 2005/0271799 A1 | 12/2005 | Moriwaki et al. | |

(Continued)

OTHER PUBLICATIONS

M. Nagamine et al., "Conceptual material design for magnetic tunneling junction cap layer for high magnetoresistance ratio" Presented Nov. 2, 2005. (Journal of Applied Physics 99, 08K703 (2006).*

(Continued)

*Primary Examiner*—Jerome Jackson, Jr.
*Assistant Examiner*—Jami M Valentine
(74) *Attorney, Agent, or Firm*—Saile Ackerman LLC; Stephen B. Ackerman

(57) ABSTRACT

An MTJ in an MRAM array or TMR read head is disclosed in which a capping layer has a bilayer configuration with a non-magnetic NiFeX inner layer on a NiFe free layer and a Ta layer on the NiFeX layer to improve dR/R and minimize magnetostriction. Optionally, a trilayer configuration may be employed where the Ta layer is sandwiched between an inner NiFeX layer and an outer Ru layer. The X component in NiFeX is preferably an element having an oxidation potential greater than Ni or Fe such as Mg, Hf, Zr, Nb, or Ta. NiFeX is preferably formed by co-sputtering a NiFe target with an X target at a forward power of about 200 W and 50 W, respectively. In an MRAM structure, the Mg content in NiFeMg may be increased to >50 atomic % to improve the gettering power of removing oxygen from the free layer.

13 Claims, 4 Drawing Sheets

U.S. PATENT DOCUMENTS

2005/0276099 A1  12/2005  Horng et al.
2006/0002026 A1  1/2006  Stipe et al.
2007/0014149 A1*  1/2007  Nagamine et al. .......... 365/158

OTHER PUBLICATIONS

Tsunekawa, et al., Paper #HP-08 "Effect Of Capping Layer Material On Tunnel Magnetoresistance In CoFeB/MgO/CoFeB Magnetic Tunnel Junctions", Digest IEEE International Magnetics Conf. (Intermag), 2005, Presented Apr. 8, 2005.*

Shen et al, "Improvement of Transport Properties in Magnetic Tunneling Junctions by Capping Materials", IEEE Transactions On Magnetics, vol. 43, No. 6, Jun. 2007.*

M. Nganime et al., "Conceptual Material Design for MTJ Cap Lagar for High MR Ratio", in abstract ED-10, 50th mmm conf., San Jose, CA (2005).

"Oxygen as a Surfactant in the Growth of Giant Magneto-resistance Spin Valves", by W. F. Egelhoff, Jr. et al., Jrnl. of Appl. Physics, vol. 82, No. 12, Dec. 15, 1997, pp. 6142-6151.

"Ternary NiFeXas a Soft Biasing Film in a Magneto-resistive Sensor," by Mao-Min Chen et al., Jrnl. of Appl. Physics, vol. 69, No. 8, Apr. 15, 1991, pp. 5631-5633.

D. Wang et al., "70% TMR at Room Temperature for SDT Sandwich Junctions with CoFeB as Free and Pinned Lagers", in abstract BD-03, mmm Conf., Marquis NW, Jan. 6, 2004, p. 87.

"Table of standard electrode potentials," from Answers.com.htm, from http://www.answers.com/main/ntquery; jsessionid=38994t133wl,w on Apr. 14, 2006.

* cited by examiner

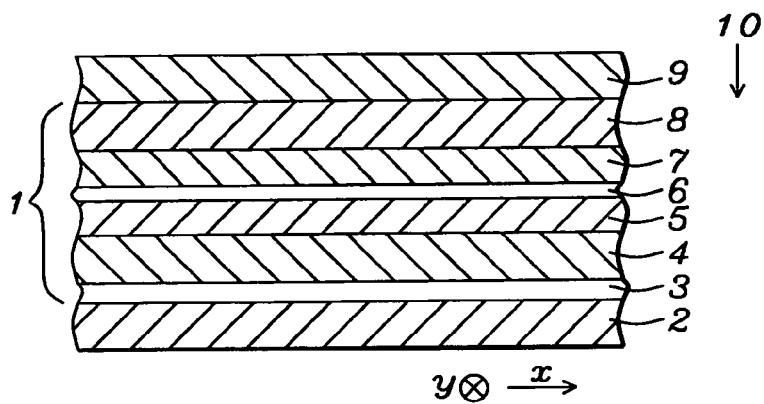
FIG. 1 — Prior Art
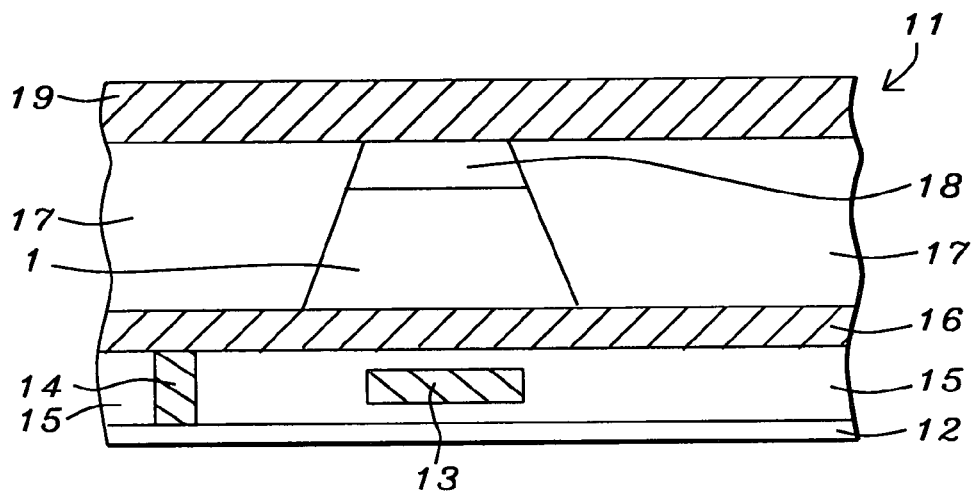
FIG. 2 — Prior Art
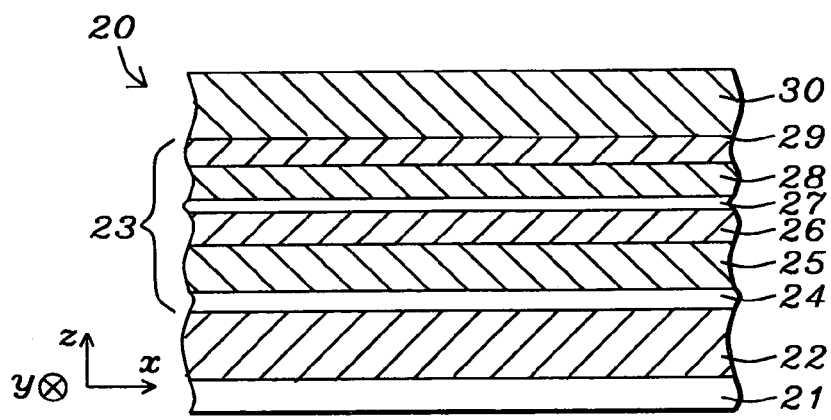
FIG. 3 — Prior Art

METHOD TO FORM A NONMAGNETIC CAP FOR THE NIFE(FREE) MTJ STACK TO ENHANCE DR/R

RELATED PATENT APPLICATIONS

This application is related to the following: Ser. No. 10/868,715, filing date Jun. 15, 2004; and Ser. No. 10/844,171, filing date May 12, 2004.

FIELD OF THE INVENTION

The invention relates to a high performance Magnetic Tunneling Junction (MTJ) element and a method for making the same, and more particularly, to a non-magnetic bilayer or trilayer capping layer that increases the magnetoresistive (MR) ratio while minimizing magnetostriction.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, Flash, etc. A MRAM device is generally comprised of an array of parallel first conductive lines on a horizontal plane, an array of parallel second conductive lines on a second horizontal plane spaced above and formed in a direction perpendicular to the first conductive lines, and an MTJ element interposed between a first conductive line and a second conductive line at each crossover location. A first conductive line may be a word line while a second conductive line is a bit line or vice versa. Alternatively, a first conductive line may be a bottom electrode that is a sectioned line while a second conductive line is a bit line (or word line). There are typically other devices including transistors and diodes below the array of first conductive lines as well as peripheral circuits used to select certain MRAM cells within the MRAM array for read or write operations.

In FIG. 1, an MTJ element 1 is shown that is based on a tunneling magneto-resistance (TMR) effect wherein a stack of layers has a configuration in which two ferromagnetic layers are separated by a thin non-magnetic dielectric layer. In an MRAM device, the MTJ element is formed between a bottom electrode 2 such as a first conductive line and a top electrode 9 which is a second conductive line. The bottom electrode 2 typically has a seed layer/conductive layer/capping layer configuration such as Ta/Cu/Ta, TaN/Ta/TaN, or NiCr/Ru/Ta. The bottom layer 3 in the MTJ element 1 is generally comprised of one or more seed layers that may be NiCr or Ta/NiCr, for example, which promote a smooth and dense crystal growth in overlying MTJ layers. Next, an antiferromagnetic (AFM) pinning layer 4 is formed such as PtMn or IrMn. There is a ferromagnetic "pinned" layer 5 on the AFM layer 4 that may be a composite of multiple layers including CoFe layers. The thin tunnel barrier layer 6 above the pinned layer 5 is generally comprised of a dielectric material such as amorphous AlOx, AlTiOx, or crystalline MgO. A ferromagnetic "free" layer 7 above the tunnel barrier layer 6 in a MRAM MTJ is preferably made of NiFe because of its reproducible and reliable switching characteristics as demonstrated by a low switching field (Hc) and switching field uniformity (σHc). At the top of the MTJ stack is a capping layer 8. This MTJ stack has a so-called bottom spin valve configuration. Alternatively, an MTJ stack may have a top spin valve configuration in which a free layer is formed on a seed layer followed by sequentially forming a tunnel barrier layer, a pinned layer, AFM layer, and a capping layer.

The pinned layer 5 has a magnetic moment that is fixed in the y direction by exchange coupling with the adjacent AFM layer 4 that is also magnetized in the y direction. The free layer 7 has a magnetic moment that is either parallel or antiparallel to the magnetic moment in the pinned layer. The tunnel barrier layer 6 is so thin that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current 10 is passed from the top electrode 9 to the bottom electrode 3 in a direction perpendicular to the MTJ layers, a lower resistance is detected when the magnetization directions of the free and pinned layers are in a parallel state ("1" memory state) and a higher resistance is noted when they are in an anti-parallel state or "0" memory state.

In a read operation, the information stored in an MRAM cell is read by sensing the magnetic state (resistance level) of the MTJ element through a sense current flowing top to bottom through the cell in a current perpendicular to plane (CPP) configuration. During a write operation, information is written to the MRAM cell by changing the magnetic state in the free layer to an appropriate one by generating external magnetic fields as a result of applying bit line and word line currents in two crossing conductive lines, either above or below the MTJ element. In certain MRAM architectures, the top electrode or the bottom electrode participates in both read and write operations.

A high performance MTJ element is characterized by a high magnetoresistive (MR) ratio which is dR/R where R is the minimum resistance of the MTJ element and dR is the change in resistance observed by changing the magnetic state of the free layer. A high MR ratio of over 30% and a low magnetostriction ($\lambda_s$) value of about 1×10E-06 or less are desirable. This result is accomplished by (a) well controlled magnetization and switching of the free layer, (b) well controlled magnetization of a pinned layer that has a large exchange field and high thermal stability and, (c) integrity of the tunnel barrier layer. In order to achieve good barrier properties such as a specific junction resistance×area (RA) value and a high breakdown voltage (Vb), it is necessary to have a uniform tunnel barrier layer which is free of pinholes that is promoted by a smooth and densely packed growth in the AFM and pinned layers. Although a high RA value of about 10000 ohm-$\mu m^2$ is acceptable for a large area (A), RA should be relatively small (<1000 ohm-$\mu m^2$) for smaller areas. Otherwise, R would be too high to match the resistivity of the transistor which is connected to the MTJ.

Referring to FIG. 2, the MTJ 1 element is shown disposed on a bottom conductor 16 in an MRAM cell 11 that has a top conductor 19. The substrate 12 is comprised of a transistor (not shown) that is typically connected to the bottom conductor by a stud 14. A word line 13 is formed below the MTJ element 1 and within a first insulation layer 15 that is usually a composite layer consisting of a stack of two or more dielectric layers on the substrate which are not shown in order to simplify the drawing. The MTJ element 1 contacts the top conductor 19 (bit line) through a capping layer 18 and is formed in a second insulation layer 17 that is disposed on the bottom conductor 16. From a top-down perspective (not shown), a plurality of MTJ elements is formed in an array between multiple rows of bottom conductors and multiple columns of top conductors.

In addition to MRAM applications, an MTJ element with a thinner tunnel barrier layer to give a very low RA (<5 ohms-$\mu m^2$) may be employed in TMR sensor head applications. Referring to FIG. 3, a portion of a TMR read head 20 on a substrate 21 is shown from the plane of an air bearing surface (ABS). There is an MTJ element 23 formed between a bottom lead 22 which is a bottom shield (S1) and a top lead 30 which is an upper shield (S2). The MTJ element 23 is comprised of a seed layer 24, an AFM layer 25, a pinned layer 26, a tunnel barrier layer 27, a free layer 28, and a cap layer 29 which are sequentially formed on the bottom lead 22 and have a composition and function similar to the corresponding layers in the MTJ element 1 described previously. The free layer 28 is made of a composite CoFe/NiFe layer. In this example, the NiFe layer in the bottom lead 22 represents S1 and the NiFe layer in the top lead 30 represents S2. A read operation involves moving the read head along the ABS in the z direction over a recording medium which causes an external magnetic field to influence the magnetization direction of the free layer.

Generally, the purpose of the capping layer is to protect underlying layers in the MTJ during etching and CMP processes and to function as an electrical contact to an overlying bit line. U.S. Pat. No. 6,266,218 describes a magnetic sensor in which a non-magnetic cap layer is comprised of Ta, Ru, or oxides thereof. An MTJ stack is described in U.S. Pat. No. 6,909,633 and has a capping layer made of Cu, Pd, Pt, Rh, Ti, Cr, Ru, Os, or a binary metallic material such as NiCr or CuNi. In U.S. Pat. No. 6,909,630, the capping layer is a high conductivity metal such as Cu, Au, Ag, Rh, Ru, Al, or Ta.

There are several references in the prior art where a magnetic layer is deposited in a sputtering system by co-sputtering two targets. In U.S. Pat. No. 6,893,714 and related U.S. Patent Application 2005/0271799, a ferromagnetic alloy and a non-magnetic oxide are co-sputtered to form a magnetic layer. U.S. Patent Application 2006/0002026 describes a reactive sputtering process where a magnetic recording material and a matrix material such as $SiO_x$ may be co-deposited on a substrate. U.S. Patent Application 2002/0045070 describes co-sputtering with a non-magnetic target (oxide) and a magnetic target to form fine magnetic dots dispersed in a non-magnetic matrix.

According to M. Nagamine et. al in "Conceptual material design for MTJ cap layer for high MR ratio" in abstract ED-10, $50^{th}$ MMM conference, San Jose, Calif. (2005), a Ta capping layer yields a higher dR/R than a Ru capping layer. This result is due to a higher oxidation potential for Ta than for Ru. It is also known that NiFe with a Ru cap is positively charged while NiFe with a Ta cap is negatively charged. Thus, Ta is much more reactive with oxygen in the free layer and is a more efficient "getter" than Ru. As stated by W. Egelholf et. al in "Oxygen as a surfactant in the growth of giant magnetoresistive spin valve" in J. Appl. Phys., 82, p. 6142-51 (1997), oxygen is highly mobile in the transition metals and alloys thereof such as NiFe, CoFe, Cu, and Ru and has a strong tendency to float out to the surface. During thermal annealing, Ta is capable of gettering oxygen atoms originating in the NiFe free layer. Consequently, the NiFe free layer is less oxygen contaminated and a more distinct boundary between the tunnel barrier layer and NiFe free layer is thereby obtained to improve dR/R. The disadvantage of using a Ta capping layer is that Ta diffuses into NiFe during thermal annealing to produce an alloy that not only reduces free layer moment (Bs) but makes NiFe very magnetostrictive with a $\lambda_S$ of $\geq 5 \times 10^{-6}$. Thus, an improved capping layer is needed that enables both a high MR ratio and low $\lambda_S$ value to be achieved in MTJs for advanced MRAM and TMR read head technologies.

SUMMARY OF THE INVENTION

One objective of the present invention is to provide a non-magnetic capping layer in an MTJ element that is comprised of NiFeX and is very efficient in gettering oxygen atoms from an adjacent NiFe-containing free layer.

A second objective of the present invention is to provide a capping layer comprised of NiFeX in accordance with the first objective that provides a high dR/R of about 30% or greater while simultaneously yielding a low magnetostriction in the MTJ element.

A third objective of the present invention is to provide a method of forming an NiFeX capping layer by co-sputtering a NiFe target and a target made from an element X.

According to a first embodiment, these objectives are achieved by providing a substrate comprised of a bottom conductor electrode on which an MRAM structure is to be fabricated. An MTJ element is formed by first depositing a stack of layers on the bottom conductor electrode. In one aspect, the MTJ stack has a bottom spin valve configuration in which a seed layer, AFM layer, synthetic anti-parallel (SyAP) pinned layer, tunnel barrier layer, free layer, and a capping layer are sequentially formed. Preferably, the pinned layer has a synthetic anti-parallel (SyAP) configuration wherein a Ru coupling layer is sandwiched between two CoFe layers. The tunnel barrier layer may be comprised of amorphous AlOx, AlTiOx, or crystalline MgO. Above the tunnel barrier layer is a free layer comprised of NiFe that may have a Fe content of about 17.5 to 25 atomic % to minimize magnetostriction. A key feature is the capping layer that has a bilayer or trilayer configuration in which an inner layer adjacent to the tunnel barrier is made of NiFeX where X is a metal that has an oxidation potential greater than Ni or Fe such as Mg, Hf, Zr, Nb, or Ta. In a bilayer configuration, an outer layer made of Ta is disposed on the NiFeX layer. A trilayer configuration may be represented by NiFeX/Ta/Ru in which a Ta layer is sandwiched between an inner NiFeX layer and an outer Ru layer. All of the layers in the MTJ stack are formed by sputtering or ion beam deposition (IBD). The tunnel barrier layer is typically formed by depositing a metal or alloy and then oxidizing the metal by a radical oxidation (ROX) method, for example. The inventors have found that the best method of depositing the NiFeX layer is to co-sputter NiFe and the element X. Once all the layers in the stack are laid down, a conventional patterning and etching sequence is followed to fabricate a MTJ element. Thereafter, a dielectric layer is typically deposited on the substrate and MTJ and is thinned to be coplanar with the capping layer. A top conductor may then be formed on the MTJ and dielectric layer.

In a second embodiment, the MTJ element is formed as a sensor in a TMR read head. A bottom shield such as a NiFe layer with an overlying shield capping layer made of Ta or the like is formed on a substrate. An MTJ stack of layers as described in the first embodiment is then laid down on the shield capping layer. Preferably, the MTJ stack has a composite free layer comprised of CoFe with a Fe content of greater than about 25 atomic % and NiFe in which the Fe content is less than about 17.5 atomic %. A key element is a NiFeX/Ta or NiFeXFTa/Ru capping layer as described previously. The MTJ element is fabricated by a known patterning and etching sequence. A dielectric layer is generally formed on either side of the MTJ element to separate the MTJ from a subsequently deposited hard bias layer that provides longitudinal biasing to the free layer. A second dielectric layer is formed on the hard bias layer and is coplanar with the top surface of the MTJ. A top lead which is the upper shield is disposed on the top surface of the MTJ and on the second dielectric layer.

BRIEF DESCRIPTION OF THE DRAWINGS

FIG. 1 is a cross-sectional view showing a conventional MTJ element which is formed between a bottom electrode and a top electrode in an MRAM structure.

FIG. 2 is a cross-sectional view of an MRAM structure in which an MTJ is formed between a bottom conductor electrode and an overlying bit line while a word line is located in an insulation layer below the bottom conductor.

FIG. 3 is a cross-sectional view of a conventional MTJ element formed between bottom and top shields and which serves as a sensor in a TMR read head

DETAILED DESCRIPTION OF THE INVENTION

The present invention is an MTJ capping layer comprised of NiFeX where X is an element that has an oxidation potential greater than Ni or Fe. The NiFeX layer results in an MTJ having a higher MR ratio than conventional MTJs while achieving low magnetostriction which are properties required for high density devices with small MTJ sizes. Although MRAM and TMR read head applications are described herein, the present invention may be employed in other technologies based on an MTJ device as appreciated by those skilled in the art. The drawings are provided by way of example and are not intended to limit the scope of the invention. Moreover, the drawings are not necessarily drawn to scale and the relative sizes of various elements may differ from those in an actual device. A non-magnetic layer is defined as a non-ferromagnetic material in the description that follows.

Figure 4A:
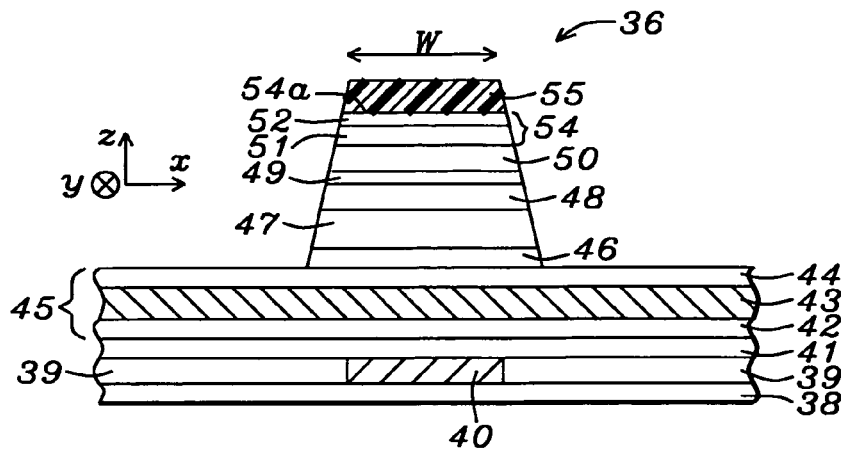
FIGS. 4a-4b are cross-sectional views of a partially formed MRAM structure in which an MTJ element containing a capping layer comprised of NiFeX is formed on a substrate according to an embodiment of the present invention.

An MRAM structure formed according to a first embodiment of the present invention will now be described. Referring to FIG. 4a, a partially completed MRAM structure 36 is shown that includes a substrate 38 which may be silicon or another semiconductor substrate used in the art that typically contains devices such as transistors and diodes. A first insulation layer 39 comprised of $Al_2O_3$, silicon oxide, or the like is disposed on the substrate 38. There is a first conductive line comprised of copper, for example, formed within and coplanar with the first insulation layer 39. For the purpose of this discussion, the first conductive line is a word line 40 that is used to conduct current in a +y or −y direction. Optionally, the first conductive line may be called a digit line, data line, row line, or column line as appreciated by those skilled in the art. The word line 40 may be enclosed on the sides and bottom by a thin diffusion barrier layer or a cladding layer (not shown). There is a second insulation layer 41 such as $Al_2O_3$ or silicon oxide formed on the word line 40 and first insulation layer 39. Above the second insulation layer 41 is a bottom conductor layer 45 that is interconnected to an underlying transistor (not shown) in substrate 38. The bottom conductor layer 45 is typically coplanar with an insulation layer (not shown). In one aspect, the bottom conductor layer 45 is a composite layer having a seed layer 42/conductive layer 43/capping layer 44 configuration.

It should be understood that the MRAM structure is part of an MRAM array in which multiple parallel word lines are formed in a first conductive layer and multiple top conductor electrodes such as parallel bit lines are formed in a second conductive layer above an array of MTJs. Alternatively, the first conductive layer may be parallel bit lines while the second conductive layer is parallel word lines. The word lines and bit lines are aligned orthogonal to each other and a bottom conductor layer may be used to connect each MTJ element with a transistor in the substrate. In the exemplary embodiment, an MTJ element is formed between a bottom conductor layer and bit line at each location where a bit line crosses over a word line.

The bottom conductor layer 45 may be a sectioned line, for example, that has a rectangular shape in the x,y plane and a thickness in the z direction. Alternatively, the bottom conductor layer 45 may be a bit line that is aligned orthogonally to an underlying word line 40 and to a subsequently formed second word line above the MTJ. In one embodiment, the bottom conductor layer 45 may have a NiCr/Ru/Ta configuration in which a seed layer 42 formed on the second insulation layer 41 is made of NiCr. Optionally, the seed layer 42 may be comprised of Ta or TaN. Above the seed layer 42 is a conductive layer 43 which is preferably comprised of Ru although Rh or Ir may be used, instead. Alternatively, other metals such as Au, Cu, or α-Ta may be used as the conductive layer 43. Note that when α-Ta is employed as the conductive layer 43, it is in a low resistance phase and is typically grown on a TaN seed layer 42.

The capping layer 44 may be a Ta layer with a thickness from about 30 to 50 Angstroms that has an amorphous character as a result of a sputter etching process. According to one embodiment, the seed layer 42, conductive layer 43, a Ta capping layer 44, and an overlying Ru layer (not shown) are sequentially deposited by a sputtering or ion beam deposition (IBD) on the second insulation layer 41. As described in Headway patent application HT03-022 which is herein incorporated by reference in its entirety, the Ru layer and a portion of the underlying Ta layer in the bottom conductor layer 45 are removed by sputter etching to generate an amorphous Ta capping layer that serves to promote uniform and dense growth in subsequently formed MTJ layers.

An MTJ stack of layers is now formed on the bottom conductor layer 45. It should be understood that the MTJ stack may be formed in the same process tool as the bottom conductor layer. For instance, the bottom conductor layer 45 and MTJ stack may be formed in an Anelva C-7100 thin film sputtering system or the like which typically includes three physical vapor deposition (PVD) chambers each having 5 targets, an oxidation chamber, and a sputter etching chamber. At least one of the PVD chambers is capable of co-sputtering. Typically, the sputter deposition process involves an argon sputter gas and the targets are made of metal or alloys to be deposited on a substrate. The bottom conductor layer 45 and overlying MTJ layers may be formed after a single pump down of the sputter system to enhance throughput.

In a preferred embodiment, the MTJ stack of layers is fabricated on the bottom conductor layer 45 by sequentially forming a seed layer 46, AFM layer 47, SyAP pinned layer 48, tunnel barrier layer 49, free layer 50, and a cap layer 54. The seed layer 46 may have a thickness of about 40 to 60 Angstroms and is preferably a layer of NiCr with a thickness of 45 Angstroms and a Cr content of about 35 to 45 atomic %. However, NiFe or NiFeCr may be used as the seed layer 46 instead of NiCr. Since the seed layer 46 is grown on an amorphous Ta capping layer 44, a smooth and dense <111> seed layer structure results that promotes smooth and densely packed growth in subsequently formed MTJ layers.

The AFM layer 47 is preferably made of MnPt with a thickness of about 100 to 200 Angstroms and more preferably 150 Angstroms although an IrMn layer having a thickness from about 50 to 100 Angstroms or a film made of NiMn, OsMn, RuMn, RhMn, PdMn, RuRhMn, or MnPtPd are also acceptable. In the exemplary embodiment, the AFM layer is magnetically aligned in the y direction. An external magnetic field may be applied during the deposition of an MTJ layer such as an AFM layer to influence a magnetization along a certain axis.

The SyAP pinned layer 48 has an AP2/Ru/AP1 configuration. The AP2 layer is formed on the AFM layer 47 and is preferably comprised of CoFe with a composition of about 10 atomic % Fe and with a thickness of about 20 to 30 Angstroms and more preferably 23 Angstroms. The magnetic moment of the AP2 layer is pinned in a direction anti-parallel to the magnetic moment of the AP1 layer. A slight difference in thickness between the AP2 and AP1 layers produces a small net magnetic moment for the SyAP pinned layer 48 along the y axis. Exchange coupling between the AP2 layer and the AP1 layer is facilitated by a coupling layer that is preferably comprised of Ru with a thickness of about 7.5 Angstroms although Rh or Ir may be used instead of Ru. In one embodiment, the AP1 layer on the Ru coupling layer is comprised of CoFe with a composition of about 25 to 50 atomic % Fe and a thickness of about 15 to 25 Angstroms and more preferably 20 Angstroms. Optionally, the AP1 layer may be a composite layer that includes a thin nano-oxide layer (NOL) such as FeTaO or CoFeO sandwiched between CoFe layers. The nano-oxide layer is employed to increase smoothness in the AP1 layer.

Above the SyAP pinned layer 48 is formed a thin tunnel barrier layer 49 which is preferably an oxidized Al layer that has an oxygen content which is close to an $Al_2O_3$ stoichiometry and is hereafter referred to as an AlOx layer. Initially, an Al layer having a thickness of about 7 to 10 Angstroms is deposited on the SyAP pinned layer 48 and is subsequently oxidized by an in-situ radical oxidation (ROX), for example. The resulting AlOx layer has a thickness of about 11 to 15 Angstroms and preferably 14 Angstroms. The tunnel barrier layer 49 has excellent smoothness and uniformity because of the smooth and densely packed seed layer 46, AFM layer 47, and SyAP pinned layer 48 grown on the Ta capping layer 44. Optionally, the tunnel barrier layer 49 may be made of AlTiOx or crystalline MgO as appreciated by those skilled in the art.

The free layer 50 formed on the tunnel barrier layer 49 may be made of a moderate spin polarization material as understood by those skilled in the art. A high spin polarization material is defined as a CoFe alloy in which the atomic % of Fe is >20%, a NiFe alloy in which the atomic % of Fe is >40%, or a $[(CoFe)_mB_n]$ alloy with $\geq 25$ atomic % Fe in the CoFe composition. More generally, a high spin polarization material is one which has a magnetization saturation (Ms) value equal to or greater than the aforementioned alloys and a moderate spin polarization material is defined as one which has an Ms value less than the aforementioned alloys.

A moderate spin polarization material helps to minimize the magnetostriction ($\lambda_S$) in the MTJ element. For example, a NiFe layer in which the Fe content is between about 17.5 and 25 atomic % and preferably 17.5 atomic %, also referred to as NiFe (17.5%), may be advantageously employed as the free layer 50. In this case, the NiFe layer has a thickness between 30 and 60 Angstroms and preferably 40 Angstroms. The free layer 50 is magnetically aligned along the y-axis (pinned layer direction). When the MTJ is elliptically shaped as seen in a top view (FIG. 6), the easy axis of the MTJ element is along the long axis (y-direction).

A key feature of the present invention is the cap layer 54 which has a bilayer or trilayer configuration comprised of NiFeX and is formed on the free layer 50. In one aspect, as shown in FIG. 4a, the cap layer 54 has a NiFeX/Ta bilayer configuration in which an inner NiFeX layer 51 with a thickness of about 10 to 50 Angstroms is disposed on the free layer 50 and an outer layer 52 made of Ta and having a thickness from 30 to 100 Angstroms is on the NiFeX layer. The NiFeX layer 51 is non-magnetic and the X component serves as a strong oxygen reactive (getter) agent. Thus, the X component preferably is a metal that has an oxidation potential higher than Ni and Fe. Thermodynamically, the electrode potential (electronegativity) of X should be less than that of Fe and Ni. Examples of metals that satisfy this requirement are Hf, Mg, Nb, Zr, and Ta. Therefore, non-magnetic alloys of NiFeMg, NiFeHf, NiFeZr, NiFeNb, and NiFeTa may be advantageously selected as the NiFeX layer 51. For example, in the case of NiFeMg, the inventors have found that a film represented by $Ni_RFe_SMg_T$ where R is 40 to 70 atomic %, S is 7 to 12 atomic %, and T is from about 20 to 55 atomic % is non-magnetic. Preferably, the R/S ratio is about 4:1 and the NiFeX layer is produced with a $Ni_{80}Fe_{20}$ target as described in a subsequent section. For a NiFeMg layer 51 in an MRAM MTJ, the Mg content is preferably greater than 40 atomic %. As the Mg content increases to 50 atomic % or greater, the NiFeMg layer becomes more powerful for gettering oxygen atoms in the NiFe free layer.

The minimum T value necessary to achieve non-magnetic NiFeX films is about 20 atomic % for X=Zr, and about 15 atomic % for X=Nb or Ta. On the other hand, if the X content is too high, the X element, especially Ta or Nb, may diffuse into the NiFe free layer and degrade the free layer properties. In an MRAM MTJ, the composition of the NiFeX layer 51 may be represented by $Ni_RFe_SX_T$ where R is 40 to 70 atomic %, S is 7 to 12 atomic %, and T is from about 20 to 55 atomic %. The ratio R/S is preferably about 4:1.

According to M. Chen et. al in "Ternary NiFeX as a soft biasing film in a magnetoresistive sensor", J. Appl. Physics, 69, p. 5631-5633 (1991), a NiFeX sputtering target with an X content greater than about 10 to 15 atomic % is not manufacturable because of its brittleness. The inventors have discovered that the preferred method for depositing a NiFeX layer 51 in an MTJ stack is by co-sputtering of NiFe and X targets. In one embodiment, the NiFe target and X target are placed at alternating positions in a sputter (PVD) chamber. For example, the NiFe target may be placed at position 2 in an Anelva C-7100 sputtering chamber while the X target is located at target position 4. Optionally, the NiFe target may be placed at position 1 and the X target at position 3. In one embodiment, the NiFe target has a Ni content of 80 atomic % and a Fe content of 20 atomic %. As explained later, the present invention also encompasses a NiFe target with a Fe content of about 10 atomic % for fabricating a NiFeX layer in a TMR read head.

It should be understood that the sputter deposition rate of a specific metal is dependent on the sputter power applied to the target cathode. Thus, the concentration of the $Ni_RFe_SMg_T$ alloy or a NiFeX layer is controlled by the power applied simultaneously to the two respective targets. In the example where X is Mg, the Mg deposition rate is faster than the NiFe deposition rate using the same applied power. To compensate for the unequal deposition rates, a higher forward power is applied to the NiFe target than to the Mg target. The preferred deposition method comprises applying a forward power of 30 Watts (W) to 80 W, and more preferably 50 W, to the Mg target and a forward power of 100 W to 500 W, and more preferably 200 W, to the NiFe target to deposit a NiFeMg layer at a pressure less than about 0.3 mTorr and at an ambient temperature. The non-magnetic property, $B_S$ (magnetic moment), of the co-sputtered NiFeMg film is measured with a B—H looper. Composition of the non-magnetic NiFeMg alloy is analyzed with a well known EDS system using electron microscopy. The present invention also encompasses an embodiment in which a NiFeX target is sputtered to form a NiFeX layer although the technology does not currently exist to fabricate a non-brittle NiFeX target of sufficient size to be useful in manufacturing.

The inner NiFeX layer 51 also functions as an inter-diffusion barrier between the NiFe free layer 50 and the outer layer 52 in the capping layer 54. Moreover, the thickness of the NiFeX layer and the X content can be adjusted to further reduce magnetostriction in the free layer 50. It should be understood that the outer Ta layer 52 may also serve as an oxygen getter layer. The Ta layer 52 is preferably an α-phase Ta layer with a low resistance. Optionally, another conductive layer may be used instead of Ta as the outer layer 52 in the capping layer 54.

Figure 4B:
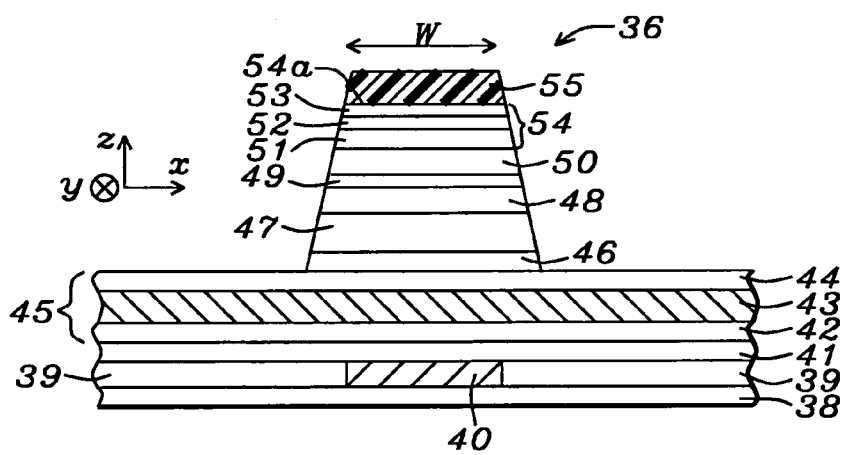

Referring to FIG. 4b, an embodiment is shown wherein the capping layer 54 has a trilayer configuration represented by NiFeX/Ta/Ru where a Ta layer 52 is sandwiched between an inner NiFeX layer 51 and an outer Ru layer 53. The Ru layer 53 is about 30 to 100 Angstroms thick and is used to prevent oxidation of the Ta layer 52 and to preserve the Ta oxidation potential. Other desirable properties of the Ru layer 53 are that it ensures good electrical contact with an overlying bit line (not shown), is inert to oxidation during annealing, and is a low resistance conductor.

It is believed that the mechanism responsible for increasing the MR ratio involves gettering oxygen in the free layer 50 by the NiFeX layer 51 and to a lesser extent by a Ta layer 52 in the capping layer 54. By employing a capping layer 54 having a bilayer or trilayer configuration including NiFeX, the underlying NiFe free layer 50 is less oxygen contaminated and has higher conductivity, thereby improving dR/R.

The present invention also encompasses an annealing step after all of the MTJ layers have been deposited. For example, in the exemplary embodiment, the MTJ stack of layers may be annealed by applying a magnetic field of 10K Oe in magnitude along the y-axis for 5 hours at a temperature above 250° C. and preferably about 280° C.

After all of the MTJ layers have been deposited and annealing is completed, an MTJ element with sidewalls and a top surface 54a is fabricated by first coating and patterning a photoresist layer 55 that has a width w on the capping layer 54. Next, the photoresist layer 55 is employed as an etch mask during an IBE sequence that removes regions of the MTJ stack of layers 46-54 which are not protected by the etch mask. Optionally, a hard mask layer (not shown) such as α-Ta is deposited on the capping layer 54 prior to coating the photoresist layer 55. The patterned photoresist layer 55 serves as an etch mask during a Reactive Ion Etch (RIE) process to remove unprotected regions of the hard mask layer. Then the photoresist layer 55 is stripped and the hard mask serves as a mask for a second RIE process that etches unprotected regions of layers 46-54. Thereafter, the hard mask may either remain on the capping layer 54 or be stripped by a conventional method. As a result, an MTJ element is formed that typically has sloped sidewalls in which the capping layer 54 has a width w and the seed layer 46 has a width greater than w.

Figure 5:
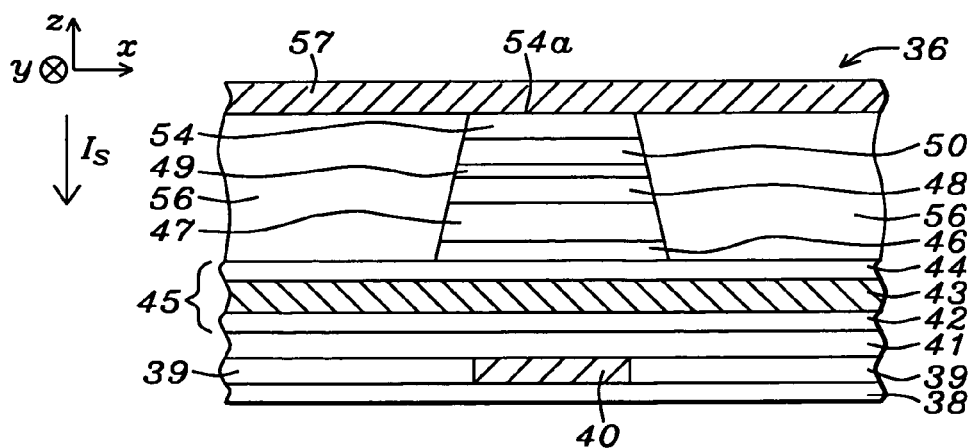
FIG. 5 is a cross-sectional view of the MRAM structure in FIGS. 4a-4b after a photoresist mask is removed and an insulation layer is formed adjacent to the MTJ element and a bit line is formed on the top surface of the MTJ element.

Referring to FIG. 5, the photoresist layer 55 is removed after an IBE etch that defines the MTJ element by a conventional method that may involve a wet stripper or an oxygen ashing process. A standard cleaning step may be performed at this point to ensure that all organic residue is removed after the stripping step. Then a third insulation layer 56 is formed on the bottom electrode 45 and adjacent to the MTJ sidewalls by a conventional method that may involve depositing an insulation material with an appropriate dielectric constant and then planarizing the third insulation layer 56 to be coplanar with the top surface 54a of the MTJ element.

The next step in fabricating the MRAM cell 40 is to form a top conductor (bit line) 57 on the third insulation layer 56 that contacts the top surface 54a of the MTJ element. The bit line 57 is aligned in a direction orthogonal to that of the word line 40 and may be comprised of more than one layer. For instance, a top conductor layer such as Cu, Au, or Al may be enclosed on the sides and bottom by a diffusion barrier layer as appreciated by those skilled in the art. Optionally, there may be a cladding layer on one or more sides of the bit line 57. In the exemplary embodiment, the bit line 57 is used to carry current in a +x or −x direction and the word line 40 has a lengthwise direction along the y-axis. When the bottom conductor layer 45 is a sectioned line with a rectangular shape, a longer side may be formed in the y direction and the shorter side may be formed in the x direction. According to a well known right hand rule, a current flowing through the bit line 57 generates a first magnetic field in the easy axis direction of the free layer while a current in the word line 40 produces a second magnetic field in the hard axis direction during a write operation. The direction of flow and magnitude of the bit line current and word line current is changed to align the magnetization of the free layer 50 in a particular direction.

Figure 6:
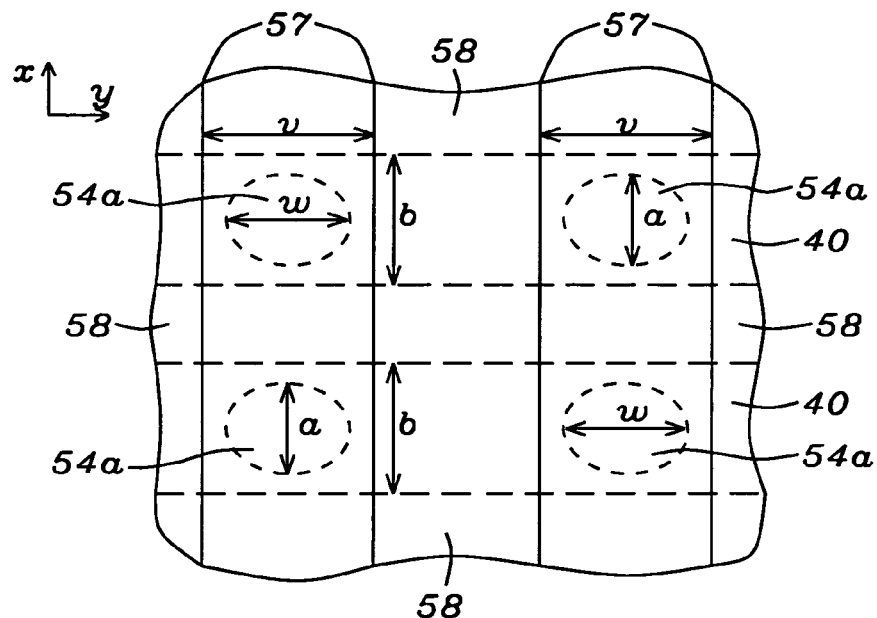
FIG. 6 is a top view of an MRAM array in which an array of elliptically shaped MTJ elements are interposed between bit lines and word lines.

Referring to FIG. 6, a top view of a portion of an MRAM array is shown that is comprised of four MRAM cells, four MTJ elements, two word lines 40 and two bit lines 57. The bottom conductor layer 45 is not shown in order to simplify the drawing. The word lines 40 have a width b and the bit lines 57 have a width v. It is understood that the bit lines 57 are coplanar with a fourth insulation layer 58 that may contain the same dielectric material as in the first, second, and third insulation layers 39, 41, 56. In a preferred embodiment, the top surface 54a of the MTJ element and each layer 46-54 within the MTJ has an elliptical shape with a length w along the long axis (y-direction) and a width a along the short axis (x-direction). However, the present invention also anticipates MTJ shapes that are circular, rectangular, diamond-shaped, or eye-shaped from a top-down view. The width v of a bit line 57 may be larger than the length w and the width b of a word line 40 may be larger than the width a of an MTJ element.

Figure 7A:
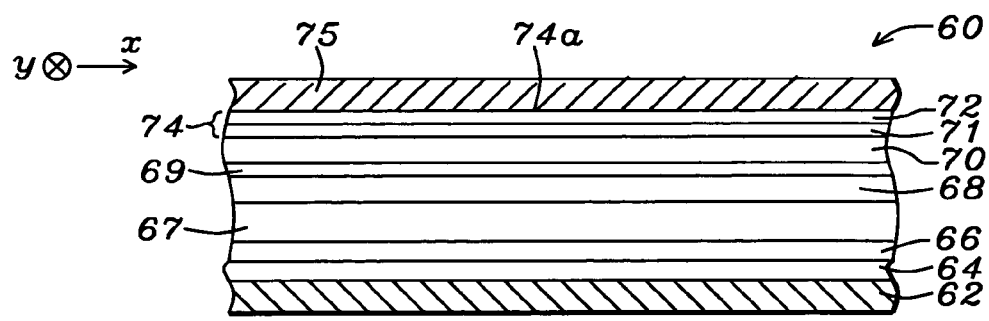
FIGS. 7a-7b are cross-sectional views of a partially formed TMR read head in which an MTJ element containing a capping layer comprised of NiFeX is formed on a substrate according to an embodiment of the present invention.

In a second embodiment depicted in FIG. 7a, a tunneling magnetoresistive (TMR) read head 60 is shown in which an MTJ element is formed between a bottom conductor hereafter referred to as a bottom (S1) shield 62 and a top conductor hereafter referred to as an upper (S2) shield 75. A capping layer 74 comprised of a NiFeX layer 71 is formed on a free layer 70 in the MTJ to enhance dR/R and provide an acceptable $\lambda_S$ value.

A substrate 62 is provided that may be a bottom shield comprised of NiFe in the TMR read head 60 as is understood by those skilled in the art. In one aspect, a shield capping layer 64 is formed on the bottom shield 62 by a previously described method that involves sequentially depositing a Ta layer with a thickness of about 50 to 80 Angstroms and a Ru layer with a thickness of between 20 and 30 Angstroms on the bottom shield 62. Thereafter, the Ru layer is removed by a sputter etch process that also partially removes the underlying Ta layer to form an amorphous Ta layer as the shield capping layer 64. The shield capping layer 64 has a thickness of about 30 to 50 Angstroms and is employed to promote a smooth and dense growth of layers in a subsequently formed MTJ element. Optionally, the shield capping layer 64 may be comprised of a composite layer in which the bottom layer functions as a capping layer for the bottom shield 62 and also promotes smooth and dense growth in subsequently formed layers as appreciated by those skilled in the art. A capping layer for an S1 shield may be amorphous $(Co_{75}Fe_{25})_{0.8}B_{0.2}$, for example.

An MTJ stack of layers is now formed on the shield capping layer 64 and may be deposited in the same process tool in which the shield capping layer is formed. Preferably, the process tool is an Anelva C-7100 sputtering system or the like which includes at least one sputter (PVD) chamber capable of co-sputtering and has the capability to form all layers in the MTJ stack of layers after a single pump down step.

In one embodiment, an MTJ stack of layers is fabricated on the shield capping layer 64 by sequentially forming a seed layer 66, AFM layer 67, SyAP pinned layer 68, tunnel barrier layer 69, free layer 70, and a capping layer 74. The seed layer 66 may be a NiCr layer with the same thickness and composition as the seed layer 46 in the first embodiment. Similarly, the AFM layer 67, SyAP pinned layer 68, and tunnel barrier layer 69 may have the same composition as described for AFM layer 47, SyAP pinned layer 48, and tunnel barrier layer 49, respectively, in the first embodiment. However, in the TMR read head 60, the initially deposited Al layer is about 4 to 6 Angstroms thick and is subsequently oxidized by a natural oxidation (NOX) process or a radical oxidation (ROX) to form the tunnel barrier layer 69.

Preferably, the free layer 70 is a composite layer with a FeCo/NiFe configuration in which the FeCo alloy has a Fe content of about 90 atomic % and a thickness of between 5 to 10 Angstroms with 10 Angstroms being preferred while the NiFe layer has a Fe content of about 10 to 17.5 atomic % and a thickness between about 30 and 40 Angstroms. The free layer 70 may be magnetically aligned in the x direction during deposition.

A key feature of the present invention is the capping layer 74 which in one aspect is a bilayer comprised of an inner NiFeX layer 71 and an outer layer 72 formed on the free layer 70. For a TMR read head, the NiFeX layer 71 has a similar thickness and properties as previously described for NiFeX layer 51. The composition of the NiFeX layer 71 may be represented by $Ni_R Fe_S Mg_T$ where R+S+T=100 and R is 40 to 70 atomic %, C is 7 to 12 atomic % and T is from about 20 to 55 atomic %. However, the X content in the NiFeX layer 71 is preferably lower and the R/S ratio is preferably higher than in the NiFeX layer 51. For example, when X=Mg in the NiFeMg layer 71, T is preferably between about 20 atomic % and 30 atomic % and the R/S ratio is about 9:1 when a $Ni_{90}Fe_{10}$ target is used. When X=Hf, Nb, Ta, or Zr, the R/S ratio is still about 9:1 and the minimum content for X necessary to achieve a non-magnetic NiFeX film is about 20 atomic % for Zr, and about 15 atomic % for Nb or Ta.

The outer layer 72 has a thickness of from 20 to 50 Angstroms and is preferably a Ta α-phase layer having a low electrical resistance. The thickness of the NiFeX layer 71 can be adjusted to reduce magnetostriction in the free layer 70. The NiFeX layer also serves as an oxygen gettering layer to remove oxygen from the free layer 70. The Ta layer 72 forms a smooth surface for optimizing electrical contact with the overlying top lead which is the upper (S2) shield of the TMR read head. In one embodiment, the NiFeX layer 71 is formed by co-sputtering a $Ni_{90}Fe_{10}$ target with an X target where X is an element having an oxidation potential greater than Ni or Fe. Note that the Fe content in the NiFe target is lower when fabricating a NiFeX layer in a TMR read head because the desired Fe content in the NiFeX layer is less than in the first (MRAM) embodiment.

Figure 7B:
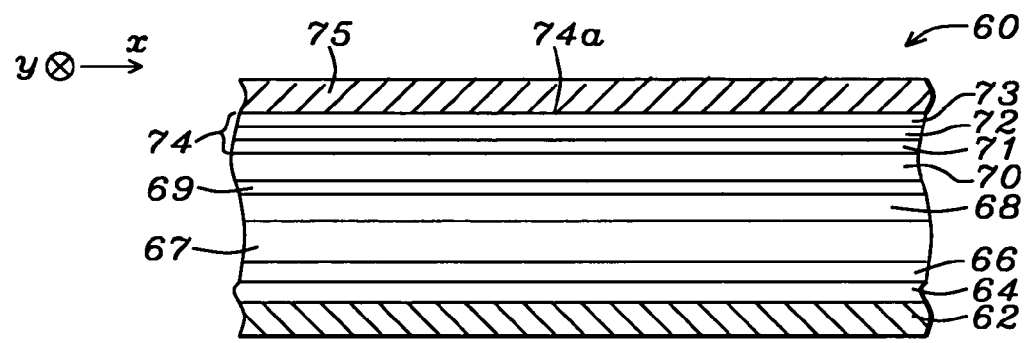
Figure 8:
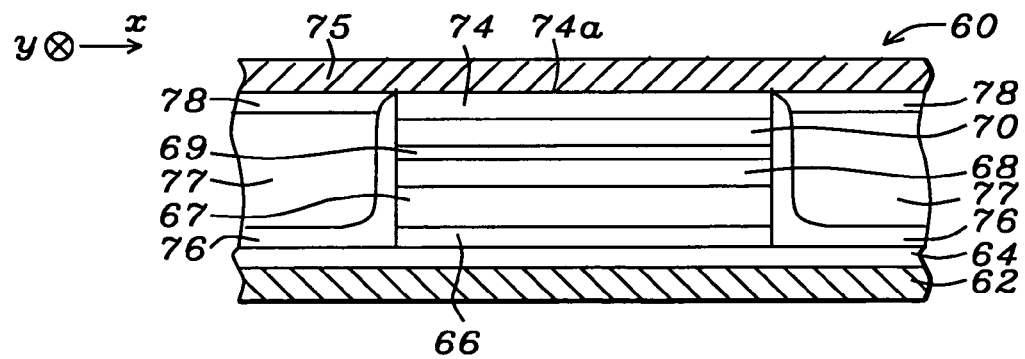
FIG. 8 is a cross-sectional view of a TMR read head in FIGS. 7a-7b where the MTJ element is formed between a bottom shield and an upper shield and is separated from a hard bias layer by an insulation layer.

Another embodiment of the present invention is depicted in FIG. 7b wherein the capping layer 74 of the TMR read head 60 has a trilayer configuration in which a Ta layer 72 is sandwiched between an inner NiFeX layer 71 and an outer layer 73 made of Ru. In this case, both the NiFeX layer and Ta layer can serve as oxygen gettering layers to remove oxygen from the free layer 70. The Ru layer 73 has a thickness of from 30 to 100 Angstroms and has similar properties to those described previously for Ru layer 53 in the first embodiment. Optionally, other metals such as Au, Cu, and Pt may be employed instead of Ru as the outer layer 73.

The present invention also encompasses one or more annealing steps after all of the layers in the MTJ stack have been deposited. For example, the AFM layer may be annealed while applying an external magnetic field along the y-axis. In the case of a TMR read head, the free layer may be annealed by applying a smaller external magnetic field along the x-axis. Annealing steps for TMR read head fabrication typically are performed at a temperature equal to or greater than 250° C.

After all of the MTJ layers have been deposited, an MTJ element in a TMR head may be fabricated by forming a lift-off photoresist pattern (not shown) on the top surface 74a followed by IBE etching to selectively remove portions of the MTJ stack of layers 66-74 which are not protected by the photoresist mask. As a result, an MTJ element is formed that typically has sloped sidewalls wherein the width of the seed layer 66 is greater than the width of the capping layer 74 and the width of the top surface 74a determines the track width. In an alternative method, a RIE etching process similar to that described in the MRAM embodiment may be used rather than IBE. Note that RIE typically produces MTJ sidewalls with less sloping than when IBE is used.

After the IBE or RIE process, a dielectric layer 76 comprised of $Al_2O_3$, for example, is deposited to a thickness of about 100 to 150 Angstroms by a chemical vapor deposition (CVD) or physical vapor deposition (PVD) on the sidewalls of the MTJ element and on the shield capping layer 64. Next, a hard bias layer 77 having a TiW/CoCrPt/Ta configuration, for example, and a second $Al_2O_3$ dielectric layer 78 are sequentially deposited on the first dielectric layer 76. The hard bias layer may have a thickness of about 200 to 300 Angstroms and the second dielectric layer has a thickness between about 200 and 250 Angstroms. The photoresist mask and overlying layers 76-78 are lifted off by a conventional method to uncover the top surface 74a. Note that the top surface 74a is preferably coplanar with the adjacent second dielectric layer 78. A chemical mechanical polish (CMP) step may be employed to planarize the second dielectric layer. An upper shield 75 is then formed on the top surface 74a and second dielectric layer 78 to complete the TMR read head 60.

An experiment was conducted to determine the performance of an MTJ stack formed on a bottom conductor (shield) in a TMR sensor according to the second embodiment. A free layer 70 comprised of a 10 Angstrom thick FeCo inner layer and a 40 Angstrom thick $Ni_{90}Fe_{10}$ outer layer was used. The MTJ stack has a seed layer/AFM layer/pinned layer/tunnel barrier/free layer/capping layer configuration and is represented by the following: NiCr4O/MnPt100/CoFe (10%)23/Ru/CoFe(25%)20/AlOx-7/free layer/capping layer. Note that the AlOx tunnel barrier was formed by oxidizing a 5 Angstrom thick Al layer. Each MTJ stack was annealed with a 10000 Oe magnetic field for 5 hours at 250° C. The results in Table 1 were obtained by using a B-H looper, EDS, Capres CIPT (current in plane tunneling), and a magnetostriction tool. The Capres CIPT tool measures RA and dR/R on an unpatterned MTJ stack.

potential of Ta. In addition, the Ru layer provides good electrical contact to an overlaid top conductor line.

In the second embodiment involving a TMR head, the dR/R response of the MTJ stack is dominated by the high polarization FeCo (AlOx/FeCo) interface layer and the dR/R contribution from the $Ni_{90}Fe_{10}$/NiFeX cap interface is minor. For MRAM applications as described in the first embodiment, the most commonly used free layer is a thin permalloy layer such as $Ni_{80}Fe_{20}$. To make non-magnetic NiFeMg for an MRAM MTJ structure, Mg concentration in the NiFeMg layer should be around 50 atomic % in order to provide a higher oxygen gettering power. Thus, considering the higher spin polarization of $Ni_{80}Fe_{20}$ compared to $Ni_{90}Fe_{10}$ and the high oxygen gettering power of the non-magnetic NiFeMg cap, a much higher dR/R improvement than 10% is expected to be achieved for MRAM-MTJ structures.

The advantages of the present invention are that a high dR/R ratio with a low magnetostriction of about $1 \times 10E-06$

TABLE 1

Magnetic Properties of MTJs with Different Capping Layers

| Capping Layer | NiFe/Mg power | Mg at. % | RA Ω-μm2 | dR/R | Lambda (λs) | dR/R Gain |
|---|---|---|---|---|---|---|
| NiFeMg20/Ta40 | 200 W/50W | 30.9 | 3.01 | 33.2% | +2.0E−6 | 6.10% |
| NiFeMg20/Ta40 | 300 W/50W | 22.8 | 2.91 | 33.5% | +1.30E−6 | 7.02% |
| NiFeMg20/Ta40 | 500 W/50W | 12.3 | 3.05 | 33.9% | −2E−7 | 8.65% |
| Ru10/Ta60 | Reference | — | 2.95 | 31.3% | +1.2E−6 | Ref. |
| NiFeMg15/Ta45/Ru40 | 200 W/50W | 30.9 | 2.91 | 36.2% | +1E−6 | 8.70% |
| Ru15/Ta60/Ru30 | POR | — | 2.91 | 33.3% | +1E−6 | POR |

The inventors have previously practiced a method that employs a Ru/Ta capping layer on the MTJ stack and that sample in the fourth row under "Capping Layer" in Table 1 is listed as a reference sample. The current process of record (POR) practiced by the inventors has a Ru/Ta/Ru trilayer as the capping layer and is shown in the bottom row. Note that a $\lambda_S$ value of about 1.0E-6 or less is desirable. A $\lambda_S$ value in the range of −1.0E-7 to +1.0E-7 where (−) indicates a compressive stress and (+) indicates a tensile stress means the free layer is non-magnetorestrictive. The first two NiFeMg/Ta capping layers (bilayer configuration) in Table 1 are non-magnetic and both MTJ stacks exhibit a low $\lambda_S$ value similar to the reference but have a substantial improvement (6%-7%) in dR/R compared with the reference capping layer. When the Mg content is less than about 23 atomic % as in the sample with 12.3 atomic % Mg, the interface between NiFeMg and the FeCo/NiFe free layer is slightly magnetic (NiFeMg cap is slightly magnetic).

Referring again to Table 1, note that MTJs with a trilayer cap (NiFeMg/Ta/Ru and Ru/Ta/Ru POR) provide a higher dR/R than MTJs with a bilayer cap. The NiFeMg/Ta/Ru capping layer has an 8.7% gain in dR/R compared with the POR trilayer configuration. Compared with the reference sample that has a Ru/Ta bilayer cap, the capping layer with a NiFeMg/Ta/Ru configuration improves dR/R by 15.7%. This indicates that the Ta intermediate layer in the trilayer capping structure is also effective in gettering oxygen atoms in the free layer. A lower dR/R for the bilayer cap structures is believed to be caused by oxidation of the 7-8 Angstrom thick Ta layer to form a 22 Angstrom thick TaO layer even though annealing is performed in a high vacuum. As a result, the TaFTaO electrode potential is reduced compared with Ta only. However, with the NiFeX/Ta/Ru trilayer cap structure, the Ru layer prevents Ta oxidation and thereby preserves the electrode can achieved by employing a MTJ capping layer comprised of a non-magnetic NiFeX layer where X is a metal that has an oxidation potential greater than Ni or Fe. In particular, the NiFeX functions as an oxygen getter layer to remove oxygen from the underlying NiFe free layer while simultaneously acting as a diffusion barrier so that an overlying Ta portion of the capping layer does not diffuse into the free layer. NiFeX is a more efficient oxygen gettering layer than Ta because the former is in direct contact with the free layer. Thus, a high performance MTJ for use in advanced MRAMs or TMR read heads can be realized with a unique combination of high dR/R, low RA, and low magnetostriction by employing a composite capping layer on the MTJ stack as described herein. A co-sputtering of NiFe and X targets enables a NiFeX layer to be formed that has a sufficiently high X content for the alloy to be non-magnetic.

While this invention has been particularly shown and described with reference to, the preferred embodiment thereof, it will be understood by those skilled in the art that various changes in form and details may be made without departing from the spirit and scope of this invention.

We claim:

1. An MTJ element formed between a bottom conductor layer and a top conductor layer in a magnetic device, comprising:

a composite capping layer wherein said capping layer is comprised of a non-ferromagnetic NiFeX layer formed on a free layer, a Ta layer on the NiFeX layer wherein X is an element having an oxidation potential greater than Ni or Fe, and an upper metal layer formed on the Ta layer.

2. The MTJ element of claim 1 wherein the magnetic device is an MRAM and the free layer is comprised of NiFe or wherein the magnetic device is a TMR read head and the free layer is comprised of a NiFe layer on a FeCo layer and said NiFeX layer is formed on the NiFe layer in said MRAM or in said TMR read head.

3. The MTJ element of claim 1 further comprised of a seed layer, an AFM pinning layer, a SyAP pinned layer, a tunnel barrier layer which are sequentially formed on the bottom conductor and said free layer is formed on the tunnel barrier layer.

4. The MTJ element of claim 2 wherein the X element in the NiFeX layer is Mg, Hf, Nb, Zr, or Ta.

5. The MTJ element of claim 4 wherein X is Mg and the NiFeMg layer is formed in an MRAM and has a composition represented by $Ni_R Fe_S Mg_T$ where R+S+T is 100 and R is from about 40 to 70 atomic %, S is from about 7 to 12 atomic %, T is from about 40 to 55 atomic %, and the ratio R/S is about 4:1.

6. The MTJ element of claim 4 wherein X is Mg and the NiFeMg layer is formed in TMR read head and has a composition represented by $Ni_R Fe_S Mg_T$ where R+S+T is 100 and R is from about 40 to 70 atomic %, S is from about 7 to 12 atomic %, T is from about 20 to 30 atomic %, and the ratio R/S is about 9:1.

7. The MTJ element of claim 1 wherein said NiFeX layer has a thickness from about 10 to 30 Angstroms and said Ta layer has a thickness from about 30 to 100 Angstroms.

8. The MTJ element of claim 1 wherein the composite upper metal layer is comprised of Ru with a thickness of about 30 to 100 Angstroms.

9. The MTJ element of claim 1 wherein said MTJ has magnetostriction and dR/R values that can be adjusted by changing the thickness of the NiFeX layer or the atomic % of the X element in the NiFeX layer.

10. An MTJ element formed between a bottom conductor layer and a top conductor layer in a magnetic device, comprising:
    a pinned layer;
    a tunnel barrier layer formed on the pinned layer;
    a free layer formed on the tunnel barrier layer; and
    a composite capping layer comprised of a non-ferromagnetic NiFeMg layer formed on said free layer, and a Ta layer formed on the NiFeMg layer.

11. The MTJ element of claim 10 wherein the magnetic device is an MRAM and said NiFeMg layer has a composition represented by $Ni_R Fe_S Mg_T$ where R+S+T is 100 and R is from about 40 to 70 atomic %, S is from about 7 to 12 atomic %, T is from about 40 to 55 atomic %, and the ratio R/S is about 4:1.

12. The MTJ element of claim 10 wherein the magnetic device is a TMR read head and said NiFeMg layer has a composition represented by $Ni_R Fe_S Mg_T$ where R+S+T is 100 and R is from about 40 to 70 atomic %, S is from about 7 to 12 atomic %, T is from about 20 to 30 atomic %, and the ratio R/S is about 9:1.

13. The MTJ element of claim 10 wherein said NiFeMg layer has a thickness from about 10 to 30 Angstroms and said Ta layer has a thickness from about 30 to 100 Angstroms.

* * * * *